United States Patent
Kim et al.

(10) Patent No.: US 7,902,925 B2
(45) Date of Patent: Mar. 8, 2011

(54) AMPLIFIER WITH ACTIVE POST-DISTORTION LINEARIZATION

(75) Inventors: Namsoo Kim, San Diego, CA (US); Kenneth Charles Barnett, Austin, TX (US); Vladimir Aparin, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/285,949

(22) Filed: Nov. 22, 2005

(65) Prior Publication Data
US 2007/0030076 A1 Feb. 8, 2007

Related U.S. Application Data

(60) Provisional application No. 60/705,256, filed on Aug. 2, 2005.

(51) Int. Cl.
*H03F 1/22* (2006.01)
(52) U.S. Cl. .......... 330/311; 330/283
(58) Field of Classification Search .......... 330/283, 330/311
See application file for complete search history.

(56) References Cited

U.S. PATENT DOCUMENTS

| | | | |
|---|---|---|---|
| 5,497,123 A | 3/1996 | Main et al. | |
| 6,473,595 B1 | 10/2002 | Kim et al. | 455/63 |
| 6,801,089 B2 * | 10/2004 | Costa et al. | 330/278 |
| 7,071,779 B2 | 12/2005 | Shi et al. | |
| 7,015,753 B2 * | 3/2006 | Posner et al. | 330/151 |
| 2002/0041212 A1 | 4/2002 | Bruck et al. | |
| 2005/0176399 A1 | 8/2005 | Aparin | |

FOREIGN PATENT DOCUMENTS

| | | |
|---|---|---|
| JP | 57164602 | 10/1982 |
| JP | 08097644 | 4/1996 |
| KR | 200037693 | 7/2000 |
| KR | 100388373 | 9/2003 |

OTHER PUBLICATIONS

Ding et al. "*A+18dBm IIP3 LNA in 0.35 μm CMOS*" ISSCC 2001/ Session 10/ Wireless Building Blocks 1/10.5 pp. 162-162-163, 443.
Aparin et al. "*Modified Derivative Superposition Method for Linearizing FET Low-Noise Amplifiers:*" IEEE Transactions on Microwave Theory and Techniques, vol. 52, No. 2, Feb. 2005, pp. 571-581.

(Continued)

*Primary Examiner* — Steven J Mottola
(74) *Attorney, Agent, or Firm* — Howard S. Seo; William M. Hooks

(57) ABSTRACT

An amplifier, which has good linearity and noise performance, includes first, second, third, and fourth transistors and an inductor. The first and second transistors are coupled as a first cascode pair, and the third and fourth transistors are coupled as a second cascode pair. The third transistor has its gate coupled to the source of the second transistor, and the fourth transistor has its drain coupled to the drain of the second transistor. The first transistor provides signal amplification. The second transistor provides load isolation and generates an intermediate signal for the third transistor. The third transistor generates distortion components used to cancel third order distortion component generated by the first transistor. The inductor provides source degeneration for the first transistor and improves distortion cancellation. The sizes of the second and third transistors are selected to reduce gain loss and achieve good linearity for the amplifier.

28 Claims, 8 Drawing Sheets

OTHER PUBLICATIONS

International Search Report PCT/US06/029905-International Search Authority-European Patent Office Nov. 22, 2006.
Yanduru N K et al: "A WCDMA, GSM/GPRS/EDGE Receiver Front End without Interstage SAW Filter" Radio Frequency Integrated Circuits (RFIC) Sumposium, 2006 IEEE San Francisco, CA Jun. 11-13, Piscataway, NJ, USA, IEEE, Jun. 11, 2006, pp. 9-12, XP010925083.
Che-Hong Liao et al: "A 5.7-GHZ 0.18-/spl mu/m CMOS gain-controlled differential LNA with current reuse for WLAN receiver" IEEE Microwave and Wireless Componets Letter, IEEE Service Center, New York, NY, US. vol. 13, No. 12, Dec. 1, 2003, pp. 526-5.
Written Opinion - PCT/US06/029905—International Search Authority—European Patent Office Nov. 22, 2006.

* cited by examiner

AMPLIFIER WITH ACTIVE POST-DISTORTION LINEARIZATION

This application claims the benefit of provisional U.S. Application Ser. No. 60/705,256, entitled "Linearity improvement technique for CMOS amplifiers from low frequency to high frequency by using vectorized post-distortion," filed Aug. 2, 2005.

BACKGROUND

I. Field

The present disclosure relates generally to circuits, and more specifically to an amplifier suitable for wireless communication and other applications.

II. Background

Amplifiers are commonly used in various electronics devices to provide signal amplification. Furthermore, different types of amplifiers are available for different uses. For example, a wireless device may include a transmitter and a receiver for bi-directional communication, and the transmitter may utilize a power amplifier (PA) and the receiver may utilize a low noise amplifier (LNA) and a variable gain amplifier (VGA).

An LNA is commonly used in a receiver to amplify a low-amplitude signal received via a communication channel. The LNA is often the first active circuit encountered by the received signal and hence has a large impact on the performance of the receiver in several key areas. First, the LNA has a large influence on the overall noise figure of the receiver since the noise of the LNA is injected directly into the received signal and the noise of subsequent stages is effectively reduced by the gain of the LNA. Second, the linearity of the LNA has a large influence on both the design of subsequent stages in the receiver and the receiver performance. The LNA input signal typically includes various undesired signal components that may come from external interfering sources and leakage from a co-located transmitter. Nonlinearity in the LNA causes the undesired signal components to mix and generate cross modulation distortion (XMD) that may fall within the desired signal bandwidth. The amplitude of the cross cross modulation distortion component that falls within the desired signal bandwidth acts as noise that degrades the signal-to-noise ratio (SNR) of the desired signal. The degradation in SNR caused by LNA nonlinearity impacts the design of (and often places more stringent requirements on) subsequent stages in order to meet the overall SNR specification for the receiver. Therefore, having a more linear LNA can alleviate the performance requirements for other stages, which may result in lower power consumption and smaller circuit area for the receiver.

There is therefore a need in the art for an amplifier having good linearity and noise performance.

SUMMARY

Various embodiments of an amplifier linearized using active post-distortion (APD) are described herein. The amplifier is simple in design, has good linearity and noise performance, and is suitable for wireless communication and other high frequency applications. For example, the amplifier may be used as an LNA for a receiver in a wireless device. Active post-distortion may also be used to linearize other active circuits such as, e.g., a mixer.

In an embodiment, an amplifier (e.g., an LNA) includes first, second, third, and fourth transistors (e.g., N-FETs) and an inductor. The first and second transistors are coupled as a first cascode pair, and the third and fourth transistors are coupled as a second cascode pair. The first transistor has its source coupled to the inductor and its gate receiving an input (voltage) signal. The second transistor has its source coupled to the drain of the first transistor and its drain providing an output (current) signal. The third transistor has its gate coupled to the source of the second transistor. The fourth transistor has its source coupled to the drain of the third transistor and its drain coupled to the drain of the second transistor. The first transistor provides signal amplification. The second transistor provides load isolation and further generates an intermediate signal for the third transistor. The third transistor receives the intermediate signal and generates distortion components used to cancel third order distortion component generated by the first transistor. The fourth transistor provides load isolation. The inductor provides source degeneration for the first transistor and improves the cancellation of the third order distortion. In other embodiments, the fourth transistor may be omitted, and the drain of the third transistor may be coupled to the drain of either the first or second transistor. The sizes of the second and third transistors may be selected to reduce gain loss for the amplifier and to cancel as much third order distortion as possible.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The amplifier and other linearized active circuits described herein may be used for various applications such as communication, networking, computing, consumer electronics, and so on. These linearized active circuits may be used in wireless communication systems such as a Code Division Multiple Access (CDMA) system, a Time Division Multiple Access (TDMA) system, a Global System for Mobile Communications (GSM) system, an Advanced Mobile Phone System (AMPS) system, Global Positioning System (GPS), a multiple-input multiple-output (MIMO) system, an orthogonal frequency division multiplexing (OFDM) system, an orthogonal frequency division multiple access (OFDMA) system, a single-carrier FDMA (SC-FDMA) system, a wireless local area network (WLAN), and so on. The amplifier may be used as an LNA, a VGA, a PA, and so on. For clarity, an LNA used in a receiver of a wireless device for a CDMA system is described below. The CDMA system may implement cdma2000, Wideband CDMA (W-CDMA), and/or other CDMA radio access technologies.

Figure 1:
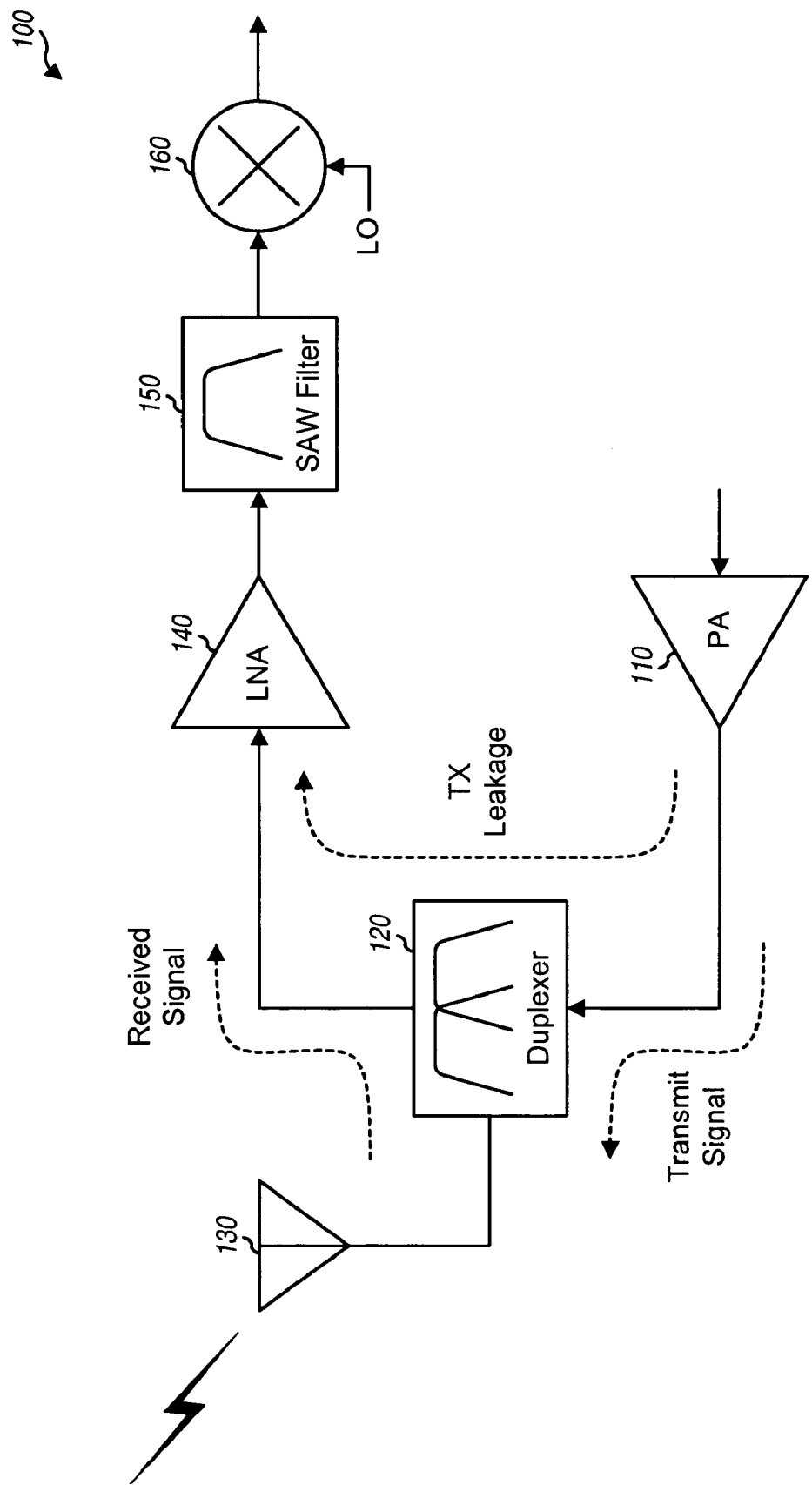
FIG. 1 shows a radio frequency (RF) portion of a wireless device.

FIG. 1 shows a block diagram of a radio frequency (RF) portion of a wireless device 100. Wireless device 100 may be a cellular phone, a personal digital assistant (PDA), a wireless modem card, or some other device used for wireless communication. Wireless device 100 includes a transmitter and a receiver that provide bi-directional communication.

On the transmit path, a power amplifier (PA) 110 receives and amplifies a transmit (TX) modulated signal and provides a transmit signal. The transmit signal is routed through a duplexer 120 and transmitted via an antenna 130 to one or more serving base stations. A portion of the transmit signal also couples or leaks through duplexer 120 to the receive path. The amount of TX leakage is dependent on the isolation between the transmit and receive ports of duplexer 120, which may be approximately 50 decibels (dB) for a surface acoustic wave (SAW) duplexer at cellular band. A lower TX-RX isolation results in higher level of TX leakage.

On the receive path, a received signal containing a desired signal and possibly a jammer is received via antenna 130, routed through duplexer 120, and provided to an LNA 140. LNA 140 also receives a TX leakage signal from the transmit path. The input signal at the input of LNA 140 may thus include the desired signal, the TX leakage signal, and the jammer. LNA amplifies the input signal and provides an amplified RF signal. A SAW filter 150 filters the amplified RF signal to remove out-of-band components (e.g., the TX leakage signal) and provides a filtered RF signal. A mixer 160 frequency downconverts the filtered RF signal with a local oscillator (LO) signal and provides a downconverted signal.

Figure 2A:
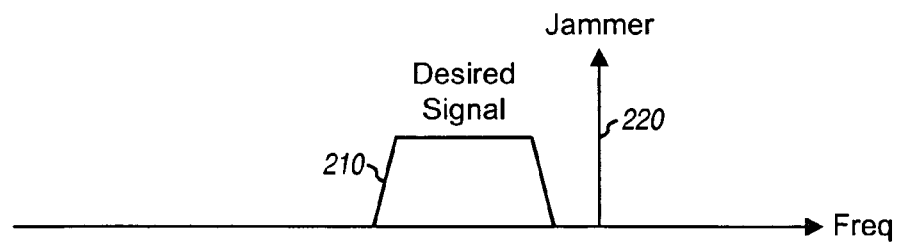
FIGS. 2A, 2B and 2C show a received signal from an antenna, an LNA input signal, and an LNA output signal, respectively.

FIG. 2A shows the received signal from antenna 130, which includes a desired signal 210 and a jammer 220. Jammer 220 is an undesired signal and may correspond to, for example, a signal transmitted by a nearby base station in an AMPS system. The jammer may be much higher in amplitude than the desired signal and may be located close in frequency to the desired signal.

Figure 2B:
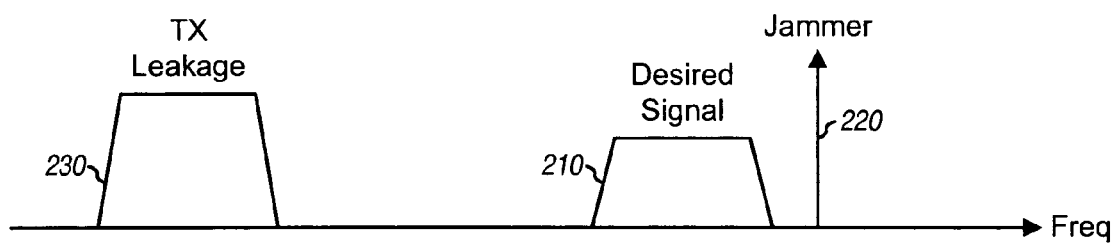

FIG. 2B shows the input signal at the input of LNA 140. The input signal contains desired signal 210 and jammer 220 in the received signal as well as a TX leakage signal 230 from the transmit path. The TX leakage signal may be large relative to the desired signal, especially if wireless device 100 is far from the serving base station(s) and needs to transmit at a high power level in order to reach the base station(s).

Figure 2C:
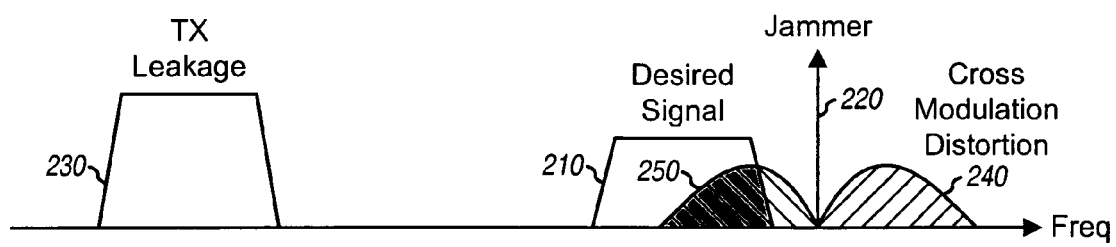

FIG. 2C shows the signal at the output of LNA 140. Nonlinearity in LNA 140 can cause the modulation on TX leakage signal 230 to interact with narrowband jammer 220 and generate cross modulation distortion 240 around the jammer. A portion 250 of the cross modulation distortion, which is shown with shading, may fall within the desired signal band. Portion 250 acts as additional noise that degrades the performance of the receiver. This noise also degrades receiver sensitivity so that the smallest desired signal that can be reliably detected by the receiver needs to have a larger amplitude.

Figure 3:
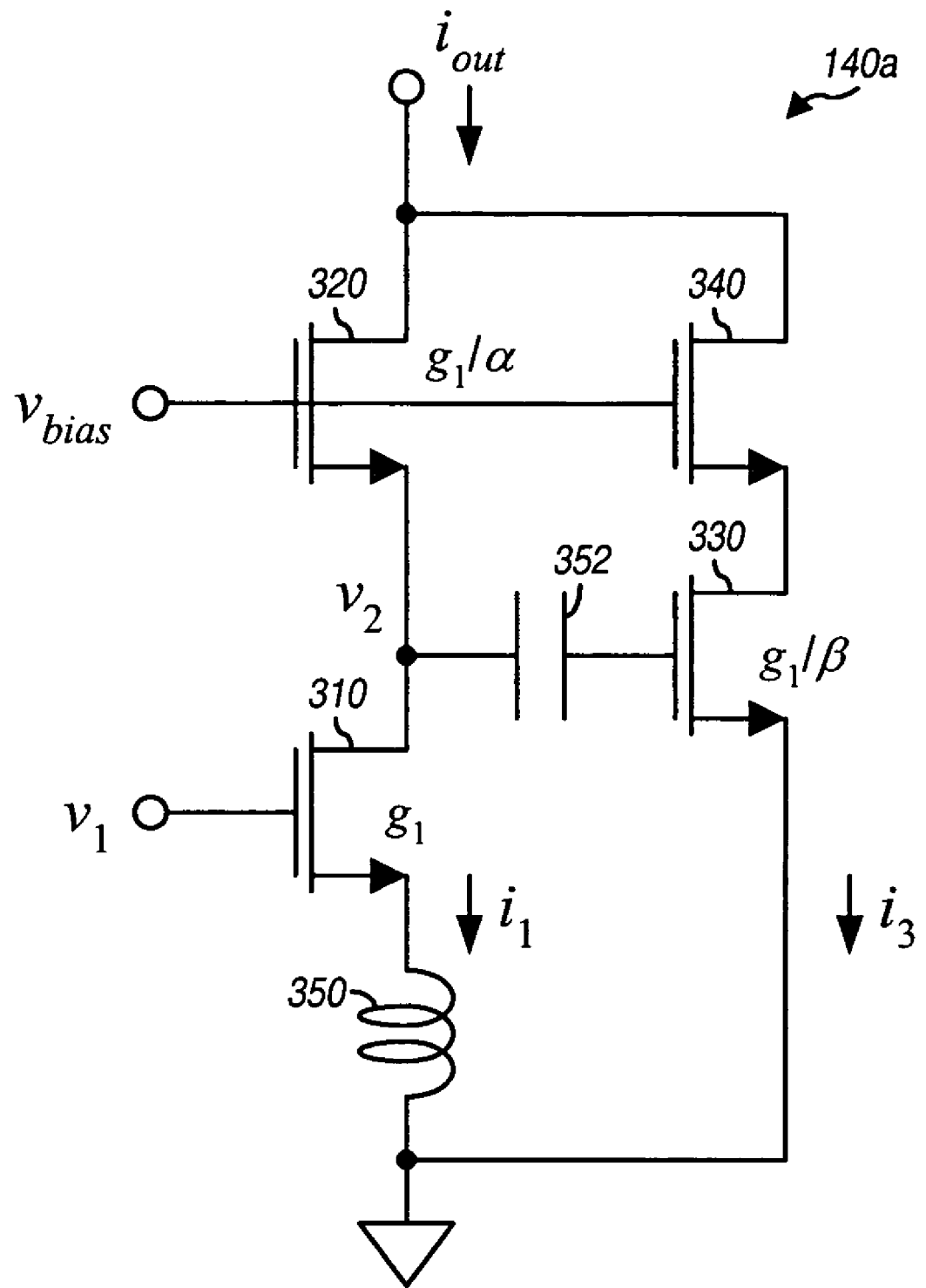
FIG. 3 shows a schematic diagram of an LNA with active post-distortion linearization.

FIG. 3 shows a schematic diagram of an embodiment of an LNA 140a with active post-distortion (APD) linearization.

LNA 140a has good linearity and noise performance and may be used for LNA 140 in FIG. 1. LNA 140a includes four N-channel field effect transistors (N-FETs) 310, 320, 330 and 340, an inductor 350, and a capacitor 352. N-FET 310 has its source coupled to one end of inductor 350, its gate receiving an input voltage $v_1$, and its drain coupled to the source of N-FET 320. The other end of inductor 350 couples to circuit ground. N-FET 320 has its gate receiving a bias voltage $v_{bias}$ and its drain coupled to an output node. N-FET 330 has its source coupled to circuit ground, its gate coupled to one end of capacitor 352, and its drain coupled to the source of N-FET 340. The other end of capacitor 352 couples to the source of N-FET 320. N-FET 340 has its gate receiving the bias voltage $v_{bias}$ and its drain coupled to the output node. The output node provides an output current $i_{out}$ for LNA 140a.

N-FETs 310 and 320 form a first cascode pair for a main signal path used for signal amplification. N-FET 310 provides signal amplification. N-FET 320 provides load isolation for N-FET 310 and further generates an intermediate voltage $v_2$ for N-FET 330. N-FETs 330 and 340 form a second cascode pair for an auxiliary signal path that generates cross modulation distortion used for distortion cancellation. N-FET 330 generates the cross modulation distortion, and N-FET 340 provides load isolation for N-FET 330. Inductor 350 provides source degeneration and further provides a 50-ohm match looking into the gate of N-FET 310. Inductor 350 is also used for active post-distortion linearization and improves distortion cancellation. Capacitor 352 provides AC coupling.

N-FET 310 has a small-signal transconductance of $g_1$, which is determined by various factors such as the size (e.g., length and width) of N-FET 310, the bias current for N-FET 310, the gate-to-source voltage $v_{gs}$ of N-FET 310, and so on. N-FET 320 has a small-signal transconductance of $g_1/\alpha$, where $\alpha$ is the ratio of the transconductance of N-FET 310 to the transconductance of N-FET 320. The factor $\alpha$ is typically determined by the ratio of the width of N-FET 310 to the width of N-FET 320. N-FET 330 has a small-signal transconductance of $g_1/\beta$, where $\beta$ is the ratio of the transconductance of N-FET 310 to the transconductance of N-FET 330. The factor $\beta$ is typically determined by the ratio of the width of N-FET 310 to the width of N-FET 330. The factors $\alpha$ and $\beta$ may be selected as described below.

Linearization of LNA 140a using active post-distortion may be achieved at low frequency as follows. At low frequency, inductor 350 does not come into play and is effectively shorted, and the input voltage $v_1$ is equal to the $v_{gs}$ voltage for N-FET 310. The drain current $i_1$ of N-FET 310 may be represented by a power series as:

$$i_1(v_{gs}) = g_1 \cdot v_{gs} + g_2 \cdot v_{gs}^2 + g_3 \cdot v_{gs}^3 + \ldots, \quad \text{Eq (1)}$$

where $g_2$ is a coefficient that defines the strength of second order nonlinearity;

$g_3$ is a coefficient that defines the strength of third order nonlinearity; and $i_1(v_{gs})$ is the drain current of N-FET 310 as a function of $v_{gs}$.

For simplicity, nonlinearities higher than third order are ignored in equation (1). Coefficients $g_1$, $g_2$ and $g_3$ are determined by the device size and the bias current for N-FET 310. Coefficient $g_3$ controls the third order intermodulation distortion (IMD3) at low signal level and hence determines the third order input intercept point (IIP3), which is a metric commonly used to specify the linearity of an amplifier.

N-FET 320 may be assumed to be linear. In this case, the drain voltage $v_2$ of N-FET 310, which is also the $v_{gs}$ voltage for N-FET 330, may be expressed as:

$$v_2 = -\frac{\alpha}{g_1} \cdot i_1. \quad \text{Eq (2)}$$

Equation (2) indicates that the $v_2$ voltage generated by N-FET 320 is dependent on $\alpha$. The drain current $i_3$ of N-FET 330 may be represented by a power series as:

$$i_3(v_2) = \frac{1}{\beta}(g_1 \cdot v_2 + g_2 \cdot v_2^2 + g_3 \cdot v_2^3 + \cdots). \quad \text{Eq (3)}$$

Equation (3) indicates that the coefficients for N-FET 330 and the coefficients for N-FET 310 are related by $\beta$.

Equation (2) may be substituted into equation (3) so that the drain current $i_3$ of N-FET 330 can be expressed as a function of the drain current $i_1$ of N-FET 310. Equation (1) may then be substituted into equation (3) so that the drain current $i_3$ of N-FET 330 can be expressed as a function of the $v_{gs}$ voltage of N-FET 310. The expanded equation (3) includes multiple terms for each order of nonlinearity due to the interaction between the power series in equation (1) and the power series in equation (3).

The drain currents of N-FETs 310 and 330 are combined to generate the output current $i_{out}$, as follows:

$$i_{out} = i_1 + i_3, \quad \text{Eq (4)}$$
$$= g_{1\Sigma} \cdot v_{gs} + g_{2\Sigma} \cdot v_{gs}^2 + g_{3\Sigma} \cdot v_{gs}^3 + \ldots,$$

where $g_{1\Sigma}$ and $g_{3\Sigma}$ are the first and third order power series coefficients, respectively, for the output current $i_{out}$ and may be expressed as:

$$g_{1\Sigma} = g_1 \cdot \left(1 - \frac{\alpha}{\beta}\right), \quad \text{Eq (5)}$$

and $$g_{3\Sigma} = g_3 \cdot \left(1 - \frac{\alpha}{\beta} - \frac{\alpha^3}{\beta}\right) + \frac{2 g_2^2 \cdot \alpha^2}{g_1 \cdot \beta}. \quad \text{Eq (6)}$$

The term $g_{2\Sigma}$ in equation (4) may be ignored since only the fundamental frequency and the third order nonlinearity are of interest.

Equation (5) represents an overall gain for LNA 140a and shows a gain loss resulting from the use of active post-distortion linearization. The overall gain for LNA 140a with distortion cancellation is $g_{1\Sigma}$ whereas the gain for the LNA without distortion cancellation is $g_1$. The gain loss of $(1-\alpha/\beta)$ is directly related to $\alpha$ and $\beta$ and may be kept small by selecting $\beta$ to be large relative to $\alpha$. A larger $\beta$ leads to less gain loss but does not necessarily mean less distortion cancellation. Equation (6) represents the combined third order distortion in the output current $i_{out}$. The first term in equation (6) represents the contribution from third order nonlinearity, and the second term in equation (6) represents the contribution from second order nonlinearity.

Figure 4A:
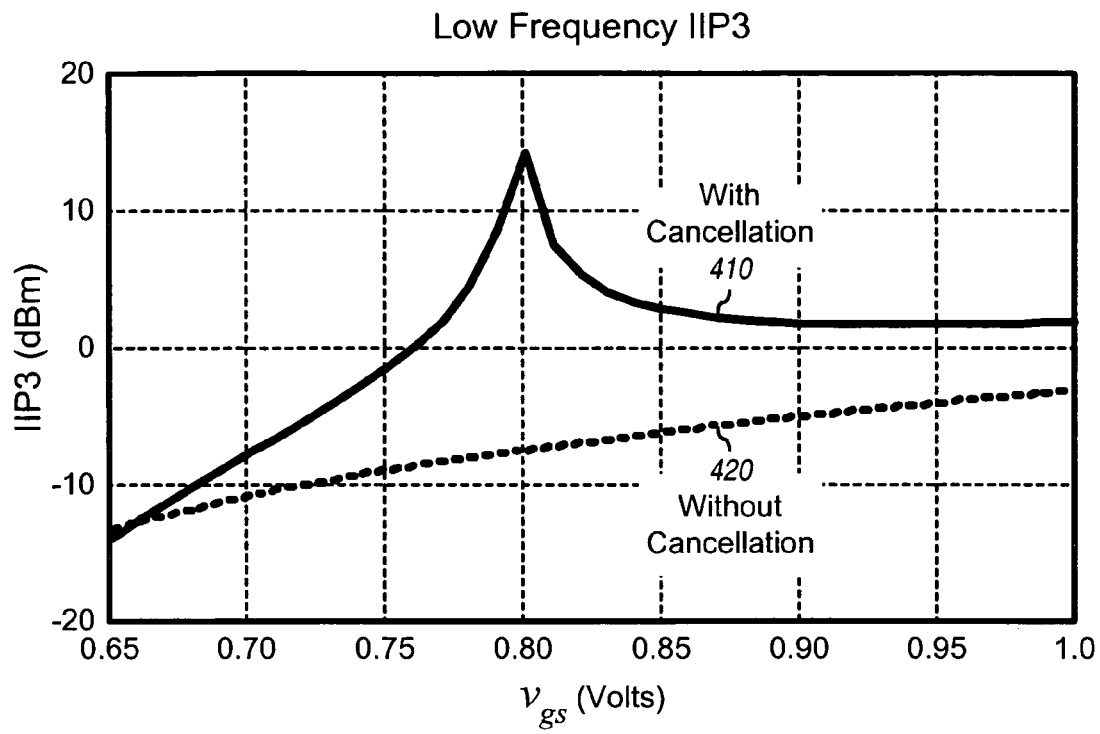
FIGS. 4A and 4B show plots of IIP3 for the LNA for low and high frequencies, respectively.

FIG. 4A shows a plot 410 of IIP3 for LNA 140a with distortion cancellation (with N-FETs 330 and 340 connected) and a plot 420 of IIP3 for LNA 140a without distortion cancellation (with N-FETs 330 and 340 omitted) at low frequency. For a given device width and power consumption, equation (6) may be solved such that the third order distortion component approaches zero. The value of $\beta$ is selected to prevent excessive gain loss. For a specific exemplary design, $\beta$ is selected to be equal to 8, and a value of 1.35 for $\alpha$ provides good distortion cancellation. Because of the second order nonlinearity in equation (6), the distortion cancellation is dependent on bias voltage, which is the operating $v_{gs}$ voltage for N-FET 310.

LNA 140a may be used for high frequency applications such as wireless communication. At high frequency, reactive elements such as capacitors and inductors affect linearity performance and further cause performance to be frequency dependent.

Figure 5:
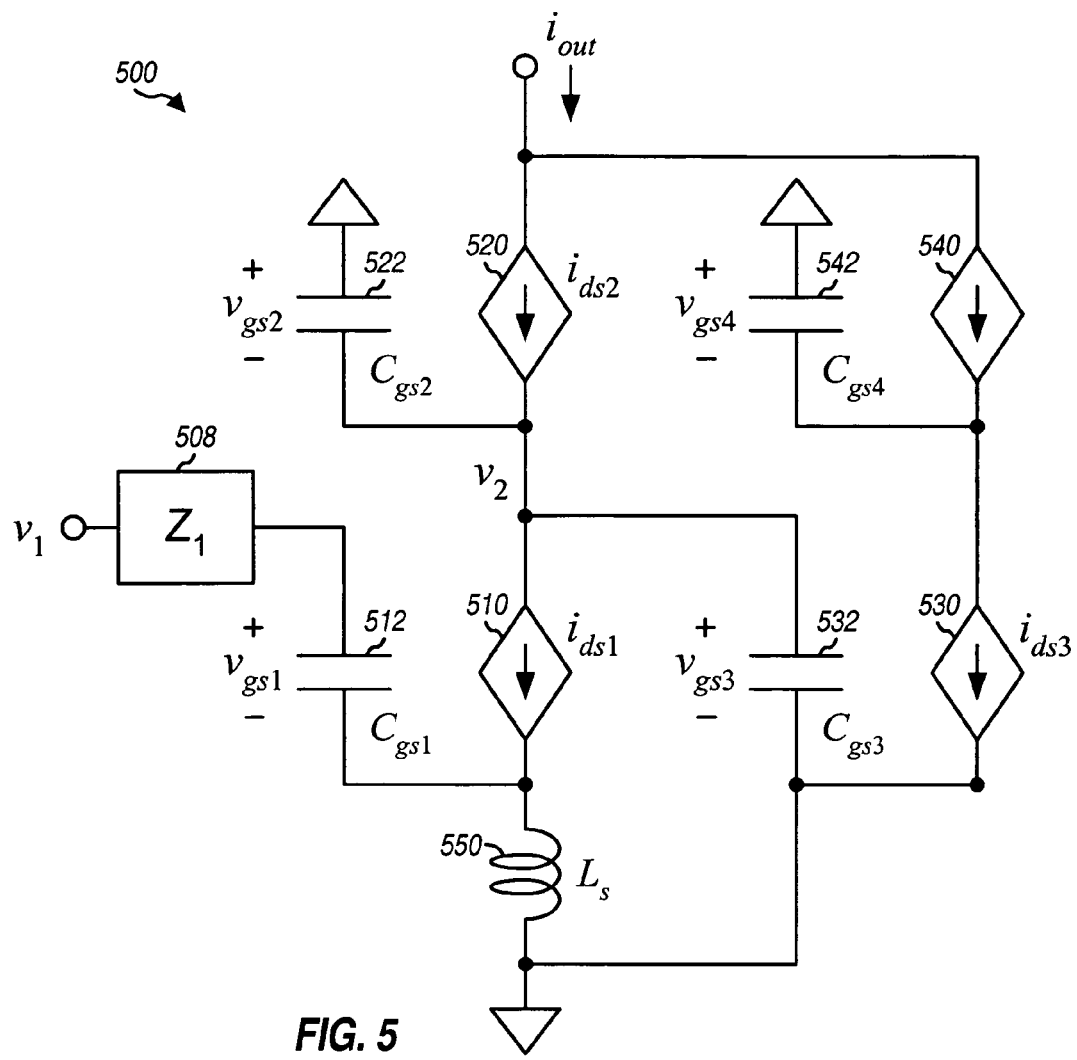
FIG. 5 shows an equivalent circuit for the LNA.

FIG. 5 shows a schematic diagram of a simplified equivalent circuit 500 for LNA 140a in FIG. 3. For the embodiment shown in FIG. 5, N-FETs 310, 320, 330 and 340 are modeled with ideal current sources 510, 520, 530 and 540, respectively, and parasitic gate-to-source capacitors 512, 522, 532 and 542, respectively. N-FETs 310, 320, 330 and 340 have gate-to-source capacitances of $C_{gs1}$, $C_{gs2}$, $C_{gs3}$ and $C_{gs4}$, respectively, and further have gate-to-source voltages of $v_{gs1}$, $v_{gs2}$, $v_{gs3}$ and $v_{gs4}$, respectively. Inductor 350 is modeled with an ideal inductor 550. A circuit 508 models the input impedance $Z_1$ of N-FET 310.

For simplicity, the following assumptions are made for equivalent circuit 500:

All parasitic capacitances are negligible except for $C_{gs}$ for each N-FET;
Parasitic resistances are zero;
The body effects of the N-FETs are negligible; and
LNA 140a operates in a weakly nonlinear region with a small input signal $v_1$.

The drain currents for current sources 510, 520 and 530 may be expressed as:

$$i_{ds1} = g_1 \cdot v_{gs1} + g_2 \cdot v_{gs1}^2 + g_3 \cdot v_{gs1}^3, \quad \text{Eq (7a)}$$

$$i_{ds2} = \frac{g_1}{\alpha} \cdot v_{gs2}, \text{ and} \quad \text{Eq (7b)}$$

$$i_{ds3} = \frac{1}{\beta} \cdot (g_1 \cdot v_{gs3} + g_2 \cdot v_{gs3}^2 + + g_3 \cdot v_{gs3}^3), \quad \text{Eq (7c)}$$

where $v_2 = v_{gs3} = -v_{gs2}$. For simplicity, only the nonlinearities of N-FETs 310 and 330 are considered, and N-FETs 320 and 340 are assumed to be linear, as indicated by equation (7b).

The output current $i_{out}$ for equivalent circuit 500 in a weakly nonlinear region may be expressed as:

$$i_{out} = C_1(s) \circ v_1 + C_2(s_1, s_2) \circ v_1^2 + C_3(s_1, s_2, s_3) \circ v_1^3, \quad \text{Eq (8)}$$

where $C_n(s_1, \ldots, s_n)$ is a Laplace transform of the n-th order Volterra kernel for $i_{out}$, which is often called the n-th order nonlinear function;

$s = j\omega$ is the Laplace variable;

$s_1, \ldots, s_n$ are frequencies operated on by the n-th order Volterra kernel; and "$\circ$" denotes a complex multiply of each frequency component of $v_1^n$ by $C_n(s_1, \ldots, s_n)$.

Equation (8) is for a Volterra series that is often used for nonlinear analysis. The Volterra series includes a Volterra kernel for each order of nonlinearity. The n-th order nonlinearity corresponds to the term $v_1^n$ and generates n frequency components. The n-th Volterra kernel is a set of n coefficients that operates on the n frequency components generated by the n-th order nonlinearity. The coefficients for each Volterra kernel may be determined by mathematical derivation or some other means. In equation (8), the third order Volterra kernel $C_3(s_1,s_2,s_3)$ determines third order nonlinearity at high frequency, which is of interest.

The gate-to-source voltage $v_{gs1}$ of N-FET 310 may be expressed as a function of the input voltage $v_1$, as follows:

$$v_{gs1} = A_1(s) \circ v_1 + A_2(s_1,s_2) \circ v_1^2 + A_3(s_1,s_2,s_3) \circ v_1^3, \quad \text{Eq (9)}$$

where $A_n(s_1, \ldots, s_n)$ is the Laplace transform of the n-th order Volterra kernel for $v_{gs1}$.

N-FET 310 generates a nonlinear current $i_{ds1}$ based on the input voltage $v_1$, as shown in equations (7a) and (9). A portion of the ids, current passes through N-FET 320 and generates the $v_2$ voltage. The $v_2$ voltage generates a nonlinear current $i_{ds3}$ through N-FET 330, as shown in equation (7c). The output current $i_{out}$ is equal to the sum of the $i_{ds1}$ current and the $i_{ds3}$ current.

Equation (8) may be evaluated to determine all distortion components. The distortion components of interest are those that affect IIP3. The distortion components generated by third order nonlinearity of N-FET 310 are denoted as $\zeta_{M1}$. The distortion components generated by nonlinearities of N-FET 330 may be categorized as follows:

$\zeta_1$: distortion components generated by second and third order nonlinearities of N-FET 310 and attenuated by a factor of $\alpha/\beta$;

$\zeta_2$: distortion components generated by second order nonlinearity of N-FET 310 multiplied by second order nonlinearity of N-FET 330; and $\zeta_3$: distortion components generated by third order nonlinearity of N-FET 330.

With active post-distortion linearization, the terms $\zeta_1$, $\zeta_2$ and $\zeta_3$ are actively generated with N-FET 330 and are used to cancel the term $\zeta_{M1}$ from N-FET 310.

The term $\zeta_1$ includes distortion components generated by second and third order nonlinearities of N-FET 310. For example, the second harmonic (2ω) at the source of N-FET 310 can mix with the fundamental frequency (ω) at the gate of N-FET 310 to generate third order intermodulation distortion. The second harmonic is due to second order nonlinearity of N-FET 310, which corresponds to the term $g_2 \cdot v_{gs1}^2$ in equation (7a). The fundamental frequency can also generate third order intermodulation distortion due to third order nonlinearity of N-FET 310, which corresponds to the term $g_3 \cdot v_{gs1}^3$ in equation (7a). These distortion components from N-FET 310 are amplified by N-FET 330 through the $g_1 \cdot v_{gs3}$ term in equation (7c) and are attenuated by a factor of $\alpha/\beta$ by the combination of N-FETs 320 and 330.

The term $\zeta_2$ includes distortion components generated by second order nonlinearities of N-FETs 310 and 330. For example, the second harmonic generated by the second order nonlinearity of N-FET 310 can mix with the fundamental frequency due to the second order nonlinearity of N-FET 330, which corresponds to the term $g_2 \cdot v_{gs3}^2$ in equation (7c), to generate third order intermodulation distortion.

The term $\zeta_3$ includes distortion components generated by third order nonlinearity of N-FET 330. The fundamental frequency from N-FET 310 can generate third order intermodulation distortion due to third order nonlinearity of N-FET 330, which corresponds to the term $g_3 \cdot v_{gs3}^3$ in equation (7c).

The nonlinearity terms for N-FETs 310 and 330 may be expressed as:

$$\zeta_{M1} = g_1 \cdot A_3(s_1, s_2, s_3) + \quad \text{Eq (10)}$$
$$2g_2 \cdot \overline{A_1(s_1) \cdot A_2(s_1, s_2)} + g_3 \cdot A_1(s_1) \cdot A_1(s_2) \cdot A_1(s_3),$$

$$\zeta_1 = -\frac{\alpha}{\beta} \cdot \zeta_{M1}, \quad \text{Eq (11)}$$

$$\zeta_2 = \frac{g_2 \cdot \alpha^2}{\beta} \cdot [2g_1^2 \cdot \overline{A_1(s_1) \cdot A_2(s_1, s_2)} + \quad \text{Eq (12)}$$
$$2g_1 \cdot g_2 \cdot A_1(s_1) \cdot A_1(s_2) \cdot A_1(s_3)], \text{ and}$$

$$\zeta_3 = -\frac{g_3 \cdot \alpha^3}{\beta} \cdot g_1^3 \cdot A_1(s_1) \cdot A_1(s_2) \cdot A_1(s_3), \quad \text{Eq (13)}$$

$$\text{where } A_1(s) = \frac{1}{s \cdot L_s \cdot g_1 + s \cdot C_{gs1} \cdot (s \cdot L_s + Z_1(s)) + 1}, \quad \text{Eq (14)}$$

$$\overline{A_1(s_1) \cdot A_2(s_1, s_2)} = -\frac{1}{3} \cdot A_1(s) \cdot |A_1(s)|^2 \cdot A_1(2s) \cdot 2s \cdot L_s \cdot g_2, \text{ and} \quad \text{Eq (15)}$$

$$A_3(s_1, s_2, s_3) = s \cdot L_s \cdot A_1^2(s) \cdot |A_1(s)|^2 \cdot \left[\frac{2}{3} \cdot g_2^2 \cdot A_1(2s) \cdot 2s \cdot L_s - g_3\right]. \quad \text{Eq (16)}$$

Equations (14), (15) and (16) indicate that the inductance $L_s$ of inductor 350 is included in various intermediate terms that make up $\zeta_1$, $\zeta_2$ and $\zeta_3$. Inductor 350 improves cancellation of third order distortion generated by N-FET 310, at high frequency.

In the above equations, $s=j\omega$, $s_1=j\omega_1$, $s_2=j\omega_2$, and $s_3=j\omega_3$ are different closely spaced signal frequencies, with $\omega \approx \omega_1 \approx \omega_2 \approx \omega_3$, so that $\Delta\omega = \omega_2 - \omega_1$ is much smaller than $\omega_1$ and $\omega_2$. Substituting equations (14), (15) and (16) into equations (10), (11), (12) and (13), and assuming conjugate match at ω, the total third order distortion in the output current $i_{out}$, $IM3_\Sigma$, may be expressed as:

$$IM3_\Sigma = A_1(s) \cdot |A_1(s)|^2 \cdot \left(1 - \frac{\alpha}{\beta}\right) \cdot g_3 \cdot \left[\frac{1}{2} - \frac{\alpha^3}{\beta - \alpha}\right] - \quad \text{Eq (17)}$$
$$A_1(s) \cdot |A_1(s)|^2 \cdot \left(1 - \frac{\alpha}{\beta}\right) \cdot$$
$$\left(\frac{2}{3} \cdot g_2^2 \cdot A_1(2s) \cdot 2s \cdot L_s \cdot \left[\frac{1}{2} + \frac{\alpha^2}{\beta - \alpha}\right]\right) + 2\frac{\alpha^2 \cdot g_2^2}{\beta \cdot g_1} \cdot A_1^3(s).$$

$IM3_\Sigma$ in equation (17) corresponds to the third order Volterra kernel $C_3(s_1,s_2,s_3)$ in equation (8).

In equation (17), the term in the first row represents third order nonlinearity, the term in the second row represents second order nonlinearity with second order harmonic, and the term in the third row represents second order nonlinearity. The values of α and β may be selected such that these three distortion components cancel out as much as possible, the total third order distortion is minimized, and the highest possible IIP3 is achieved for LNA 140a.

Figure 6:
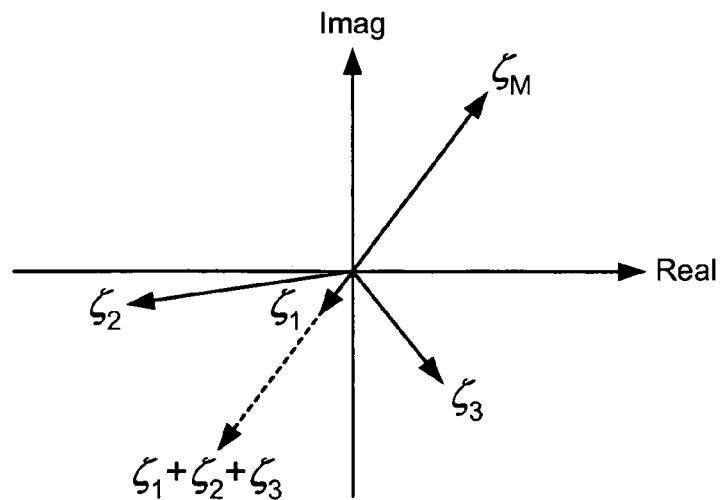
FIG. 6 shows a vector diagram illustrating active post-distortion cancellation.

FIG. 6 shows a vector diagram that illustrates the distortion cancellation mechanism of active post-distortion. The terms $\zeta_1$, $\zeta_2$ and $\zeta_3$ are dependent on the signal frequency (s=jω), the coefficients $g_1$, $g_2$ and $g_3$ of the N-FETs, and the degeneration inductance $L_s$. The terms $\zeta_1$, $\zeta_2$ and $\zeta_3$ can have different amplitudes and phases at a given frequency, as shown by the three vectors for these three terms. The sum of the three terms $\zeta_1$, $\zeta_2$ and $\zeta_3$ is shown by a dashed vector, which should be equal in amplitude but opposite in phase with the vector for $\zeta_{M1}$, so that the total distortion is minimize.

Figure 4B:
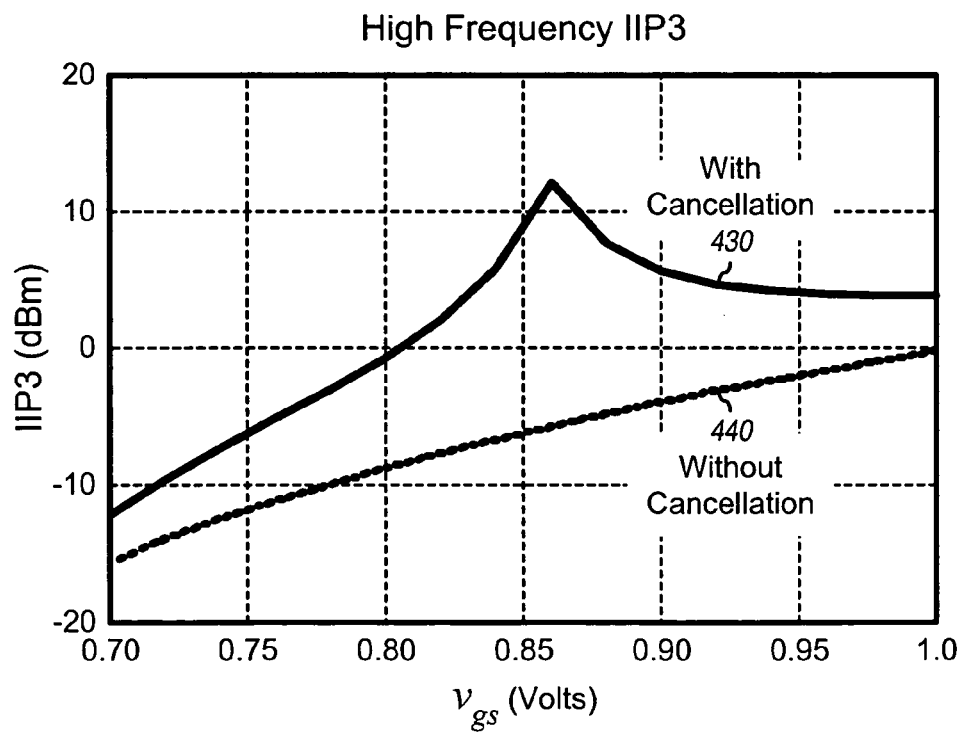

FIG. 4B shows a plot 430 of IIP3 for LNA 140a with distortion cancellation and a plot 440 of IIP3 for LNA 140a without distortion cancellation at high frequency. For a given device width and power consumption, equation (17) may be solved to make the third order distortion component approach zero. The value of β is selected to prevent excessive gain loss. For a specific exemplary design, β is selected to be equal to 8, and a value of 1.77 for α provides good distortion cancellation. The value for α that minimizes distortion at high frequency may be different from the value for α at low frequency. The different α for high frequency is due to the distortion component generated by second order nonlinearity interacting with second harmonic, which corresponds to the second line in equation (17).

The noise performance of LNA 140a is degraded slightly with active post-distortion linearization. The noise from N-FET 310 is approximately the same as the noise from a conventional inductively degenerated LNA. With active post-distortion linearization, additional noise is generated by N-FET 330 in the form of gate induced noise and drain noise. Both of these additional noise sources may be reduced by increasing β, which results in less gain loss and smaller degradation in noise figure.

Figure 7B:
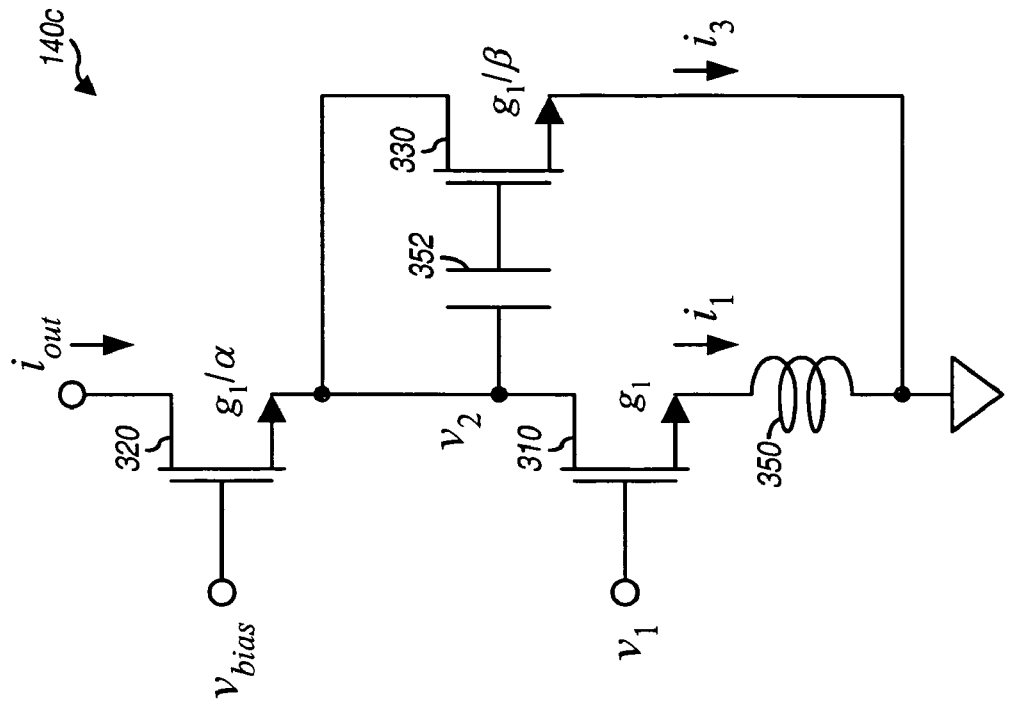
FIGS. 7A and 7B show schematic diagrams of two additional embodiments of an LNA with active post-distortion linearization.
Figure 7A:
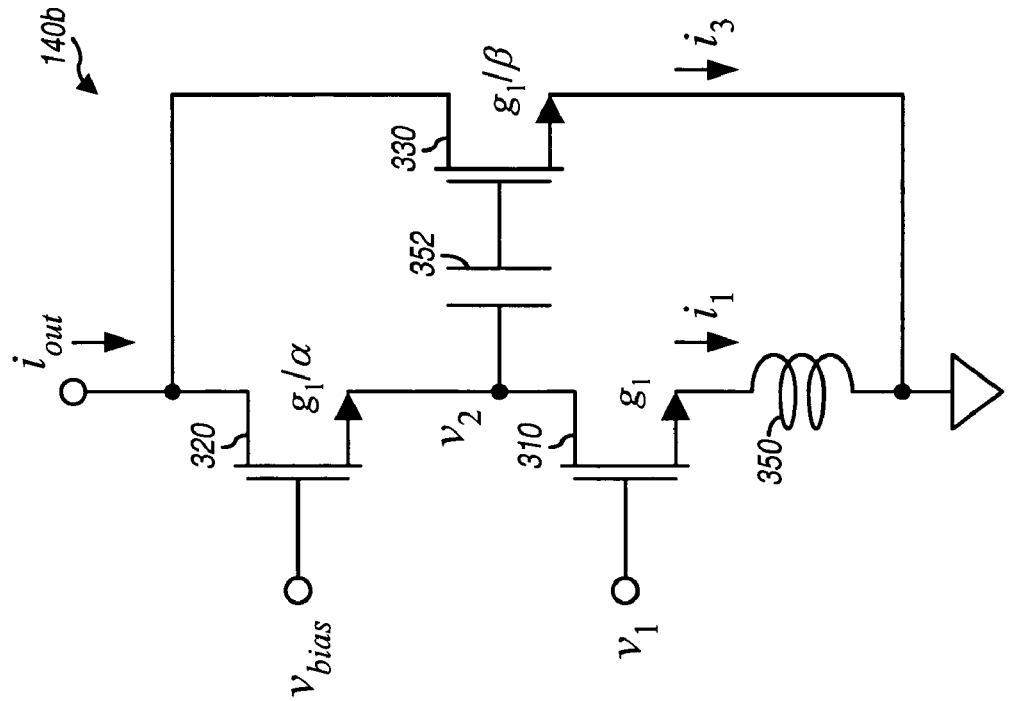

FIG. 7A shows a schematic diagram of an embodiment of an LNA 140b with active post-distortion linearization. LNA 140b includes N-FETs 310, 320 and 330, inductor 350, and capacitor 352, which are coupled as described above for FIG. 3. However, the drain of N-FET 330 is coupled directly to the output node. N-FET 340 is omitted in LNA 140b. The linearity and noise performance of LNA 140b is similar to that of LNA 140a in FIG. 3. Omitting N-FET 340 mainly affects load isolation for N-FET 330.

FIG. 7B shows a schematic diagram of an embodiment of an LNA 140c with active post-distortion linearization. LNA 140c includes N-FETs 310, 320 and 330, inductor 350, and capacitor 352, which are coupled as described above for FIG. 3. However, the drain of N-FET 330 is coupled directly to the source of N-FET 320. N-FET 340 is omitted in LNA 140c. The linearity and noise performance of LNA 140c is similar to that of LNA 140a in FIG. 3.

Figure 8:
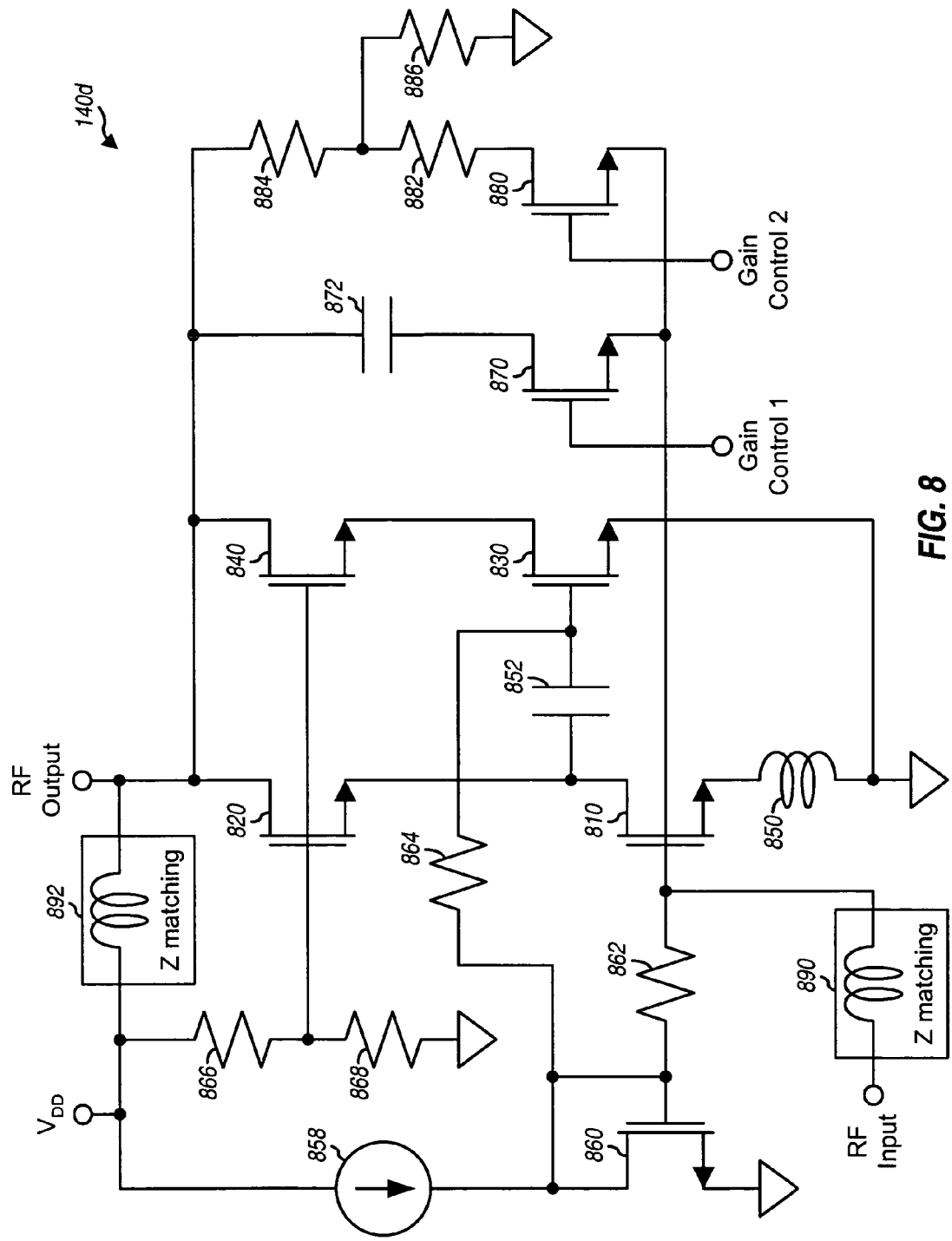
FIG. 8 shows a schematic diagram of an LNA with active post-distortion linearization and multiple gain settings.

FIG. 8 shows a schematic diagram of an embodiment of an LNA 140d with active post-distortion linearization and multiple gain settings. LNA 140d includes N-FETs 810, 820, 830 and 840, an inductor 850, and a capacitor 852 that are coupled in the same manner as N-FETs 310, 320, 330 and 340, inductor 350, and capacitor 352, respectively, in FIG. 3. LNA 140d further includes additional circuitry that provides biasing, gain control, and impedance matching.

The bias circuitry for LNA 140d includes a current source 858, an N-FET 860, and resistors 862, 864, 866 and 868. Current source 858 has one end coupled to a power supply $V_{DD}$ and the other end coupled to the drain of N-FET 860. N-FET 860 is diode connected and has its source coupled to circuit ground and its gate coupled to its drain. Resistor 862 has one end coupled to the gate of N-FET 810 and the other end coupled to the gate of N-FET 860. Resistor 864 has one end coupled to the gate of N-FET 830 and the other end coupled to the gate of N-FET 860. The bias current for N-FET 810 is determined by (1) the current provided by current source 858 and (2) the ratio of the width of N-FET 810 to the width of N-FET 860. Similarly, the bias current for N-FET 830 is determined by (1) the current provided by current source 858 and (2) the ratio of the width of N-FET 830 to the width of N-FET 860. Resistor 866 has one end coupled to the $V_{DD}$ supply and the other end coupled to the gates of N-FETs 820 and 840. Resistor 868 has one end coupled to circuit ground and the other end coupled to the gates of N-FETs 820 and 840. Resistors 866 and 868 determine the gate bias voltage for N-FETs 820 and 840, which does not need to be precisely set.

The gain control circuitry for LNA 140d includes N-FETs 870 and 880, a capacitor 872, and resistors 882, 884 and 886. N-FETs 870 and 880 have their sources coupled to the gate of N-FET 810 and their gates receiving two gain control signals. Capacitor 872 has one end coupled to the drains of N-FETs 820 and 840 and the other end coupled to the drain of N-FET 870. Resistors 882 and 884 are coupled in series. Resistor 882 has one end coupled to the drain of N-FET 880 and the other end coupled to resistors 884 and 886. The other end of resistor 884 is coupled to the drains of N-FETs 820 and 840, and the other end of resistor 886 is coupled to circuit ground.

N-FETs 810, 820, 830 and 840 form a gain signal path, N-FET 870 forms a pass-through signal path, and N-FET 880 forms an attenuation signal path. One of the three signal paths is selected as any given moment based on the two gain control signals. If N-FET 870 is turned on and the pass-through signal path is selected, then the input signal passes through N-FET 870 and AC coupling capacitor 872 to the LNA output. If N-FET 880 is turned on and the attenuation signal path is selected, then the input signal passes through N-FET 880 and is attenuated by the resistor network.

An input impedance matching circuit 890 couples between an RF input and the gate of N-FET 810. An output impedance matching circuit 892 couples between an RF output and the $V_{DD}$ supply. Each impedance matching circuit may include one or more inductors, capacitors, strip lines, and so on. Matching circuit 892 also provides bias current for N-FETs 810, 820, 830, 840 and 880.

Figure 9:
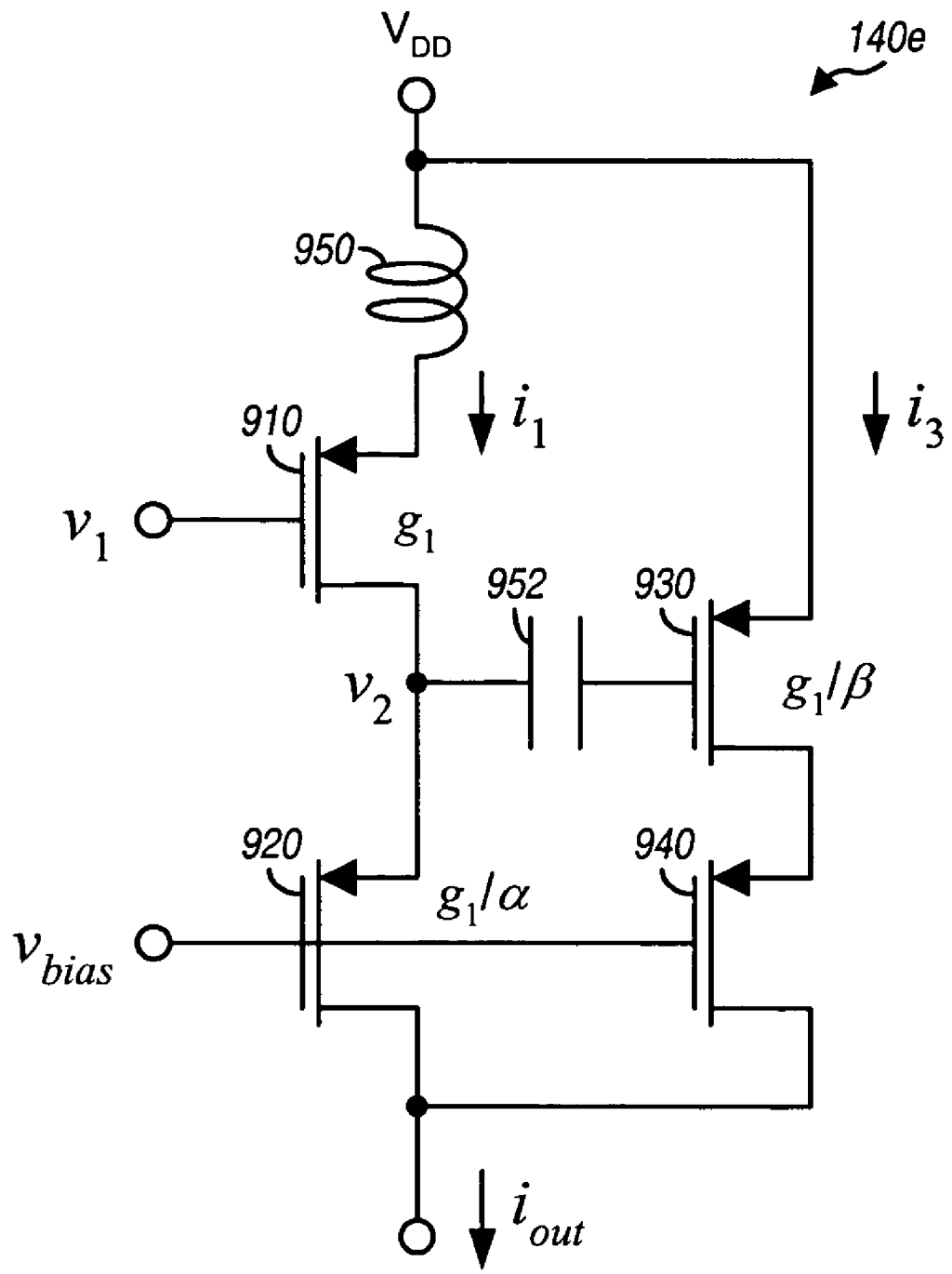
FIG. 9 shows a schematic diagram of an LNA implemented with P-FETs.

FIG. 9 shows a schematic diagram of an embodiment of an LNA 140e with active post-distortion linearization. LNA 140e includes four P-channel FETs (P-FETs) 910, 920, 930 and 940, an inductor 950, and a capacitor 952. P-FET 910 has its source coupled to one end of inductor 950, its gate receiving the input voltage $v_1$, and its drain coupled to the source of P-FET 920. The other end of inductor 950 couples to the $V_{DD}$ supply. P-FET 920 has its gate receiving the bias voltage $v_{bias}$ and its drain coupled to the output node. N-FET 930 has its source coupled to the $V_{DD}$ supply, its gate coupled to one end of capacitor 952, and its drain coupled to the source of P-FET 940. The other end of capacitor 952 couples to the source of P-FET 920. P-FET 940 has its gate receiving the bias voltage $v_{bias}$ and its drain coupled to the output node. The output node provides the output current $i_{out}$ for LNA 140e.

As noted above, the techniques for linearizing an active circuit using active post-distortion may be used for various types of active circuit such as amplifier, mixer, and so on. The main signal path for the active circuit generates distortion due to nonlinearity of the circuit elements in the main signal path. An auxiliary signal path actively generates distortion components used to cancel the distortion components generated by the main signal path.

The amplifier and other linearized active circuits described herein may be used for various frequency ranges including baseband, intermediate frequency (IF), RF, and so on. For example, these linearized active circuits may be used for frequency bands commonly employed for wireless communication, such as:

Cellular band from 824 to 894 MHz,
Personal Communication System (PCS) band from 1850 to 1990 MHz,
Digital Cellular System (DCS) band from 1710 to 1880 MHz,
GSM900 band from 890 to 960 MHz, International Mobile Telecommunications-2000 (IMT-2000) band from 1920 to 2170 MHz, and Global Positioning System (GPS) band from 1574.4 to 1576.4 MHz.

The amplifier and other linearized active circuits described herein may be implemented within an integrated circuit (IC), an RF integrated circuit (RFIC), an application specific integrated circuit (ASIC), a printed circuit board (PCB), an electronic device, and so on. These linearized active circuits may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), and so on.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
    a first transistor operative to receive and amplify an input signal;
    a second transistor electrically coupled to the first transistor and operative to generate an intermediate signal and to provide an output signal;
    a third transistor electrically coupled to the second transistor and operative to receive the intermediate signal at a gate of the third transistor and to generate distortion components used to cancel a distortion component generated by the first transistor; and
    a fourth transistor electrically coupled to the second and third transistors and operative to provide load isolation.

2. The integrated circuit of claim 1, wherein the first and second transistors are coupled as a cascode pair.

3. The integrated circuit of claim 1, wherein the third transistor is operative to generate distortion components used to cancel third order distortion component generated by the first transistor.

4. An integrated circuit comprising:
    a first transistor electrically coupled to an inductor and operative to receive and amplify an input signal;
    a second transistor electrically coupled to the first transistor and operative to generate an intermediate signal and to provide an output signal;
    a third transistor electrically coupled to the second transistor and operative to receive the intermediate signal and generate distortion components used to cancel a distortion component generated by the first transistor; and
    a fourth transistor electrically coupled to the second and third transistors and operative to provide load isolation.

5. The integrated circuit of claim 1, wherein the fourth transistor has a drain electrically coupled to a drain of the second transistor.

6. An integrated circuit comprising:
    a first transistor electrically coupled to an inductor and operative to receive and amplify an input signal;
    a second transistor electrically coupled to the first transistor and operative to generate an intermediate signal and to provide an output signal; and
    a third transistor electrically coupled to the second transistor and operative to receive the intermediate signal and generate distortion components used to cancel a distortion component generated by the first transistor, wherein the third transistor has a drain electrically coupled to a drain of the first transistor.

7. The integrated circuit of claim 1, wherein the first, second, and third transistors have first, second, and third gains, respectively, wherein the first and second gains are related by a first factor, and wherein the first and third gains are related by a second factor.

8. The integrated circuit of claim 7, wherein the second factor is selected to reduce gain loss, and wherein the first factor is selected to cancel the distortion component generated by the first transistor.

9. The integrated circuit of claim 7, wherein the second factor is greater than one, and wherein the third gain is a fraction of the first gain.

10. The integrated circuit of claim 1, wherein the first, second, third and fourth transistors are N-channel field effect transistors (N-FETs).

11. The integrated circuit of claim 1, wherein the first, second, third and fourth transistors are P-channel field effect transistors (P-FETs).

12. The integrated circuit of claim 1, wherein the first, second, third and fourth transistors form a low noise amplifier (LNA).

13. An integrated circuit comprising:
    a first transistor operative to receive and amplify an input signal;
    a second transistor electrically coupled to the first transistor and operative to generate an intermediate signal and to provide an output signal;
    a third transistor electrically coupled to the second transistor and operative to receive the intermediate signal and generate distortion components used to cancel a distortion component generated by the first transistor; and
    a gain control circuit electrically coupled to the first and second transistors and operative to provide gain control for an amplifier formed by the first, second, and third transistors.

14. The integrated circuit of claim 13, wherein the gain control circuit comprises
    a fourth transistor electrically coupled to the first transistor; and
    a capacitor electrically coupled between the fourth transistor and the second transistor.

15. The integrated circuit of claim 13, wherein the gain control circuit comprises
    a fourth transistor electrically coupled to the first transistor; and
    at least one resistor electrically coupled between the fourth transistor and the second transistor.

16. The integrated circuit of claim 1, wherein the input signal is a Code Division Multiple Access (CDMA) signal.

17. An amplifier comprising:
    an inductor operative to provide source degeneration;
    a first transistor having a source electrically coupled to the inductor and a gate receiving an input signal, the first transistor operative to provide signal amplification;
    a second transistor having a drain providing an output signal and a source electrically coupled to a drain of the first transistor, the second transistor operative to generate an intermediate signal; and
    a third transistor having a gate electrically coupled to the source of the second transistor, the third transistor operative to receive the intermediate signal and generate distortion components used to cancel a distortion component generated by the first transistor.

18. The amplifier of claim 17, further comprising:
a fourth transistor having a source electrically coupled to a drain of the third transistor and a drain electrically coupled to the drain of the second transistor.

19. An apparatus comprising:
means for providing source degeneration;
means for amplifying an input signal to generate a first signal comprising a desired component and a distortion component;
means for generating a second signal comprising distortion components used to cancel the distortion component generated by the amplifying means, the second signal being generated based on both the desired component and the distortion component in the first signal;
means for combining the first and second signals to generate an output signal having the distortion component generated by the amplifying means canceled; and
means for controlling gain of the output signal.

20. The apparatus of claim 19, wherein the distortion component generated by the amplifying means is a third order distortion component.

21. A receiver for a wireless device, comprising:
a low noise amplifier (LNA) comprising
an inductor operative to provide source degeneration,
a first transistor having a source electrically coupled to the inductor and operative to provide signal amplification,
a second transistor having a source electrically coupled to a drain of the first transistor and operative to generate an intermediate signal, and
a third transistor having a gate electrically coupled to the source of the second transistor, the third transistor operative to receive the intermediate signal and generate distortion components used to cancel a distortion component generated by the first transistor;
an input impedance matching circuit electrically coupled to a gate of the first transistor and receiving an input signal for the LNA; and
an output impedance matching circuit electrically coupled to a drain of the second transistor and providing an output signal for the LNA.

22. The receiver of claim 21, wherein the LNA further comprises
a fourth transistor having a source electrically coupled to a drain of the third transistor and a drain electrically coupled to the drain of the second transistor.

23. The receiver of claim 21, wherein the LNA further comprises
a gain control circuit electrically coupled to the first and second transistors and operative to provide gain control for the LNA.

24. An apparatus comprising:
a first transistor operative to receive and amplify an input signal;
a second transistor electrically coupled to the first transistor and operative to generate an intermediate signal and to provide an output signal;
a third transistor electrically coupled to the second transistor and operative to receive the intermediate signal at a gate of the third transistor and to generate distortion components used to cancel a distortion component generated by the first transistor; and
a fourth transistor electrically coupled to the second and third transistors and operative to provide load isolation.

25. The apparatus of claim 24, wherein the fourth transistor has a drain electrically coupled to a drain of the second transistor.

26. The apparatus of claim 24, further comprising:
an inductor electrically coupled to a source of the first transistor.

27. An apparatus comprising:
a first transistor operative to receive and amplify an input signal;
a second transistor electrically coupled to the first transistor and operative to generate an intermediate signal and to provide an output signal;
a third transistor electrically coupled to the second transistor and operative to receive the intermediate signal at a gate of the third transistor and to generate distortion components used to cancel a distortion component generated by the first transistor; and
a gain control circuit electrically coupled to the first and second transistors and operative to provide gain control for an amplifier formed by the first, second, and third transistors.

28. A method comprising:
providing source degeneration;
amplifying an input signal to generate a first signal comprising a desired component and a distortion component;
generating a second signal comprising distortion components used to cancel the distortion component that was generated by amplifying the input signal, the second signal being generated based on both the desired component and the distortion component in the first signal;
combining the first and second signals to generate an output signal having the distortion component that was generated by amplifying the input signal canceled; and
controlling gain of the output signal.

* * * * *